(12) United States Patent
Takaoka et al.

(10) Patent No.: US 7,135,378 B2
(45) Date of Patent: Nov. 14, 2006

(54) PROCESS FOR FABRICATING A SEMICONDUCTOR DEVICE HAVING A PLURALITY OF ENCRUSTED SEMICONDUCTOR CHIPS

(75) Inventors: Yuji Takaoka, Kanagawa (JP); Yukihiro Kamide, Kanagawa (JP); Teruo Hirayama, Kanagawa (JP); Masaki Hatano, Kanagawa (JP)

(73) Assignee: Sony Corporation, Tokyo (JP)

( * ) Notice: Subject to any disclaimer, the term of this patent is extended or adjusted under 35 U.S.C. 154(b) by 75 days.

(21) Appl. No.: 10/719,926

(22) Filed: Nov. 21, 2003

(65) Prior Publication Data

US 2004/0113245 A1 Jun. 17, 2004

Related U.S. Application Data

(62) Division of application No. 09/816,055, filed on Mar. 23, 2001, now abandoned.

(30) Foreign Application Priority Data

Mar. 24, 2000 (JP) ............................ P2000-083367

(51) Int. Cl.
*H01L 21/76* (2006.01)
*H01L 21/46* (2006.01)
*H01L 23/544* (2006.01)

(52) U.S. Cl. ....................... 438/401; 438/462; 257/797

(58) Field of Classification Search ................ 438/107, 438/127, 618, 622, 401, 462; 257/723
See application file for complete search history.

(56) References Cited

U.S. PATENT DOCUMENTS

| | | | |
|---|---|---|---|
| 5,475,264 A | | 12/1995 | Sudo et al. |
| 5,489,554 A | * | 2/1996 | Gates ........................... 438/59 |
| 5,552,633 A | | 9/1996 | Sharma |
| 5,656,552 A | * | 8/1997 | Hudak et al. ................. 438/15 |
| 6,159,767 A | | 12/2000 | Eichelberger |
| 6,239,980 B1 | | 5/2001 | Fillion et al. |
| 6,284,563 B1 | | 9/2001 | Fjelstad |
| 6,882,126 B1 | * | 4/2005 | Watson et al. .............. 318/640 |
| 2002/0040988 A1 | * | 4/2002 | Hidaka et al. ............... 257/296 |
| 2002/0145199 A1 | * | 10/2002 | Nakamura et al. .......... 257/752 |
| 2003/0006441 A1 | * | 1/2003 | Nakamura et al. .......... 257/296 |
| 2003/0216052 A1 | * | 11/2003 | Kakamu ..................... 438/725 |
| 2004/0227201 A1 | * | 11/2004 | Borwick et al. ............ 257/414 |
| 2004/0235290 A1 | * | 11/2004 | Fukuzumi ................... 438/629 |

(Continued)

OTHER PUBLICATIONS

"Modern Dictionary of Electronics", Rudolf F. Graf, Editor, 1997, p. 507.

*Primary Examiner*—Carl Whitehead, Jr.
*Assistant Examiner*—Deloris Bryant
(74) *Attorney, Agent, or Firm*—Sonnenschein Nath & Rosenthal LLP

(57) ABSTRACT

A semiconductor device of MCM type allowing high-density assembly and a process of fabricating the same is provided. There are provided semiconductor chips mounted on a supporting substrate and incrusted in an insulation film on the supporting substrate and wiring formed in the insulation film so as to connect to each semiconductor chip through connection holes provided in the insulation film. Then, an interlayer dielectric covers such wiring that is connected to an upper layer wiring, through connection holes provided in such interlayer dielectric. In addition, an upper layer insulation film covers the upper layer wiring, and an electrode, connected to such upper layer wiring through another connection hole, is provided on such upper layer insulation film.

5 Claims, 7 Drawing Sheets

U.S. PATENT DOCUMENTS

2005/0013544 A1* 1/2005 Ouchi ........................ 385/40

2005/0211981 A1* 9/2005 Yotsuya et al. ............... 257/64

* cited by examiner

PROCESS FOR FABRICATING A SEMICONDUCTOR DEVICE HAVING A PLURALITY OF ENCRUSTED SEMICONDUCTOR CHIPS

RELATED APPLICATION DATA

This application is a divisional of application Ser. No. 09/816,055, filed Mar. 23, 2001 now abandoned. The present and foregoing applications claim priority to Japanese Application No. P2000-083367, filed on Mar. 24, 2000. All of the foregoing applications are incorporated herein by reference to the extent permitted by law.

BACKGROUND OF THE INVENTION

The present invention relates to a semiconductor device and a method for fabricating the same. More specifically, the present invention is related to a semiconductor device and a method of fabrication applying a so-called multi-chip module technology, in which a plurality of semiconductor chips is assembled as a single electronic component.

In order to respond to demands like downsizing and small energy consumption, a mounting technology in which semiconductor elements are assembled under high density is implemented, along with high integration technology of such semiconductor elements. In order to realize a further higher density assembly, among such mounting technologies, a multi-chip module (herein after referred to as MCM) technology carrying multi-chip semiconductor elements (a semiconductor chip) on a same supporting substrate as one single electronic component beforehand has been developed. Such MCM technology achieves substantial multi-functionality by assembling two or more semiconductor chips on one single base.

FIG. 7 is a plane view and an A–A' sectional view that shows one example of a conventional semiconductor device using such MCM technology. The semiconductor device shown in these figures has two semiconductor chips 102 and 103 having different functions, mounted on a supporting substrate 101. On the supporting substrate 101, multi-chip electrode pads 104 (illustrated only in the plane view) and wiring (not shown on the figures) to interconnect these electrode pads 104 are formed. In addition, each semiconductor chips 102 and 103 are interconnected by means of an electrode pad provided on the surface of the supporting substrate 101 and wiring (not shown on the figures), as well as a wire 105. Still, connection of such semiconductor device with an outside device is done through the electrode pad 104 provided on the supporting substrate 101.

In addition, in Japanese Patent Laid-Open No. Hei5-47856, there is disclosed a semiconductor device comprising: an insulation film formed as to cover plural semiconductor chips mounted on a supporting substrate (a package of ceramic circuit boards or the like); connection holes reaching the semiconductor chips and the supporting substrate on the insulation film; and wiring formed on the insulation film to connect electrode pads on the supporting substrate to the semiconductor chips through these connection holes. According to such semiconductor device, connection of the semiconductor chips to a package does not rely on wires, but on wiring formed on the insulation film covering the semiconductor chips so that it is possible to increase a number of leads taken out from the semiconductor chips, at the same time the semiconductor chips and the pads on the supporting substrate are connected by the shortest distance. In addition, a semiconductor device of a construction having inner path holes within the insulation film has been proposed in order to realize multi level interconnection.

Furthermore, in Japanese Patent Laid-Open No. Hei9-64269, there is disclosed a semiconductor device that reduces a capacity of each output buffer of plural semiconductor chips by establishing an output buffer distributing the capacity of each output buffer, to then realize downsizing of each semiconductor chip.

Other than a semiconductor device of MCM type such as described above, there is also realized a high capacity semiconductor device by making a system LSI in which the functions of plural semiconductor chips are fabricated in one single semiconductor chip.

However, regarding the semiconductor device of MCM type described above, as there are interconnections between semiconductor chips and connections of a semiconductor chip with an outside device by means of electrode pads on the supporting substrate (for example, a ceramic circuit board) on which the semiconductor chips are mounted, an area on the supporting substrate for placing the electrode pads and the wiring is required in addition to an area to implement the semiconductor chips. This, along with increasing a substantial implementation area, becomes also a factor of raising the cost of the semiconductor device.

In addition, the semiconductor device of MCM type has higher power consumption as plural semiconductor chips are sealed as one unit within a resin film or layer, thus causing generation of heat in correspondence with such power consumption. For this reason, such heating causes, in addition to causing failure in the function of the element itself formed in the semiconductor chip, the semiconductor chips unstick due to a difference in thermal expansion coefficient between the supporting substrate and the semiconductor chips, and further causing a problem of generating cracks in the resin that seals the semiconductor device.

On the other hand, in a system LSI type semiconductor device, as plural functions (memory and logic, for example) are made within one single semiconductor chip, the design process and the wafer process becomes complex, the yield decreases, the fabrication cost increases and, furthermore, the TAT (Turn Around Time) is prolonged, as compared to a semiconductor device of MCM type.

SUMMARY OF THE INVENTION

It is an object of the present invention to provide a compact semiconductor device of low power consumption, capable of high speed operation due to a reduction in implementation area and a reduced wiring distance between chips, and a process for fabricating the same.

A first embodiment of the present invention to achieve such an object is a semiconductor device characterized by comprising: a plurality of semiconductor chips mounted on a supporting substrate; an insulation film provided on the supporting substrate so as to have the semiconductor chips incrusted therein; and wiring provided on the insulation film and connected with each semiconductor chip through connecting holes formed in such insulation film.

With the semiconductor device of such construction, the plural semiconductor chips are directly interconnected by means of wiring formed on the insulation film without passing through the supporting substrate. As a result, it is not necessary to provide space on the supporting substrate for an electrode pad or wiring, so that it is enough to have only space for mounting the semiconductor chips. Therefore, it is possible to pursue downsizing of the semiconductor device.

In addition, a second semiconductor device of the present invention is characterized by comprising: a plurality of semiconductor chips; an insulation layer holding each of these semiconductor chips by having them incrusted from one surface so that another surface of these plural semiconductor chips are exposed; and wiring provided on the insulation layer and connected with each semiconductor chip through a connection hole formed in such insulation layer.

With the second semiconductor device of such a construction, the plural semiconductor chips are directly interconnected by means of wiring formed on the insulation layer that holds the semiconductor chips by incrusting them from one surface thereof. As a result, for this semiconductor device, it is enough to have only space for incrusting the plural semiconductor chips against the insulation layer. Furthermore, as the insulation layer serves as a supporting substrate, the thickness of the supporting substrate is reduced in comparison with the first semiconductor device. Therefore, it is possible to make the semiconductor device smaller and slimmer.

Furthermore, a third semiconductor device of the present invention is characterized by comprising a semiconductor device made by mounting plural semiconductor chips on a supporting substrate, in which specific circuits of some of semiconductor chips among the plural semiconductor chips are shared. The specific circuit in such case is an input-output interface circuit between for an external apparatus, a power supply circuit, an electrostatic protection circuit or the like.

With the semiconductor device of such a construction, as the number of circuits used in the plural semiconductor chips is reduced, power consumption can be reduced. In particular, in the case of sharing the input-output interface circuit, the power supply circuit or the like between plural semiconductor chips, as the size of such large circuits of high power consumption can be reduced, the power consumption of the semiconductor device as a whole can be largely reduced. Moreover, upon forming the semiconductor chips that do not have the above specific circuits, as it is not necessary to provide such specific circuits for all semiconductor chips, it is possible to pursue downsizing of each semiconductor chip and, thereby, downsizing of the semiconductor device constituted by using these semiconductor chips.

Moreover, the process of fabrication of the semiconductor device of the present invention comprises: a process of performing die bonding plural semiconductor chips on a supporting substrate; a process of forming an insulation film so as to incrust a semiconductor chip on the supporting substrate; and a process of forming on the insulation film wiring connected to each respective semiconductor chip through such connection hole. In addition, it is also possible to perform a process of removing the supporting substrate from the semiconductor chip and the insulation film afterwards.

In such process of fabrication of the semiconductor device of such construction, as wiring is formed on the insulation film by patterning utilizing lithography technology without relying on wire bonding, it is possible to obtain a semiconductor device having each semiconductor chip directly interconnected by means of such wiring. Furthermore, when the supporting substrate is removed, it is possible to obtain the semiconductor device holding plural semiconductor chips incrusted from one surface, thus having another surface of the plural semiconductor chips exposed.

BRIEF DESCRIPTION OF THE DRAWINGS

The foregoing and other objects, features and advantages of the present invention will be apparent to those skilled in the art from the following description of the preferred exemplary embodiments of the present invention taken in conjunction with the accompanying drawings, in which.

DESCRIPTION OF THE PREFERRED EMBODIMENTS (First embodiment)

Figure 1A:
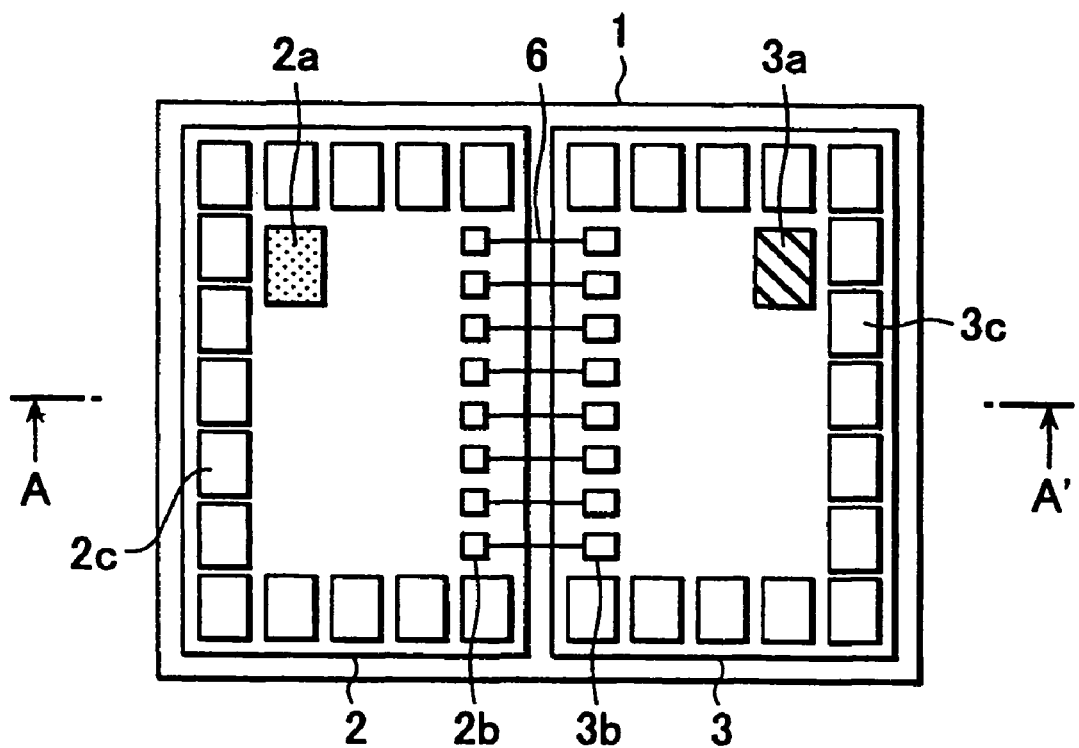
FIG. 1 is a plane view and a cross-sectional view showing a construction of a semiconductor device according to the first embodiment of the present invention.
Figure 1B:
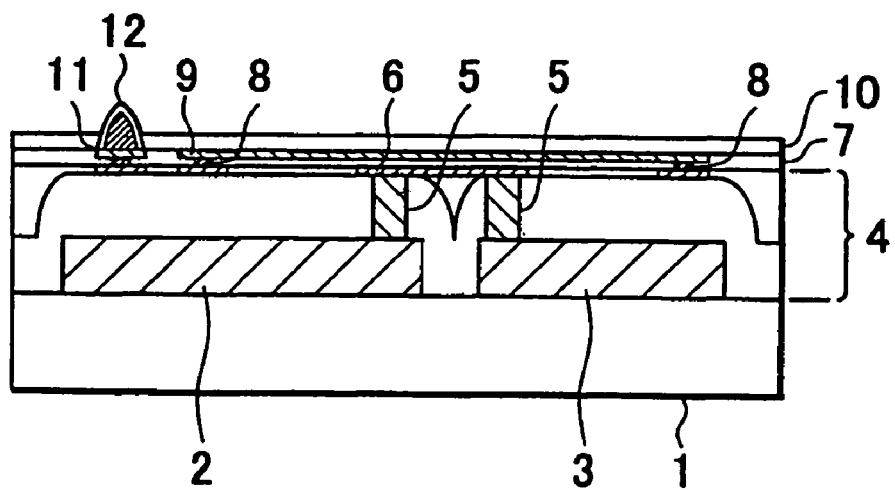

FIG. 1A is it is a plane view and FIG. 1B is an A–A' sectional view of FIG. 1A, showing a first embodiment of a semiconductor device according to the present invention. Each of an insulation film and each of a connection hole, which are constituent elements of the semiconductor device, are illustrated only in the sectional view. The semiconductor device shown in these figures is a semiconductor device of so-called MCM type, comprising a supporting substrate 1 having a plurality of semiconductor chips 2 and 3 (two shown in the figures) mounted thereon. In addition, such semiconductor chips 2 and 3 are, for example, a logic semiconductor chip 2 having a logic circuitry for signal processing and a signal controlling circuitry for a laser disc reading formed thereon, and a memory semiconductor chip 3 having a 32 Bit DRAM circuitry formed thereon.

On such semiconductor chips 2 and 3, in addition to each functional circuit (the logic and the memory circuit), an input-output interface circuit (herein after referred to as I/O circuit) 2a and 3a, a power supply interface circuit, not illustrated in the figures hereof (herein after referred to as power supply circuit) and also an electrostatic protection circuit or the like are respectively provided. However, an I/O circuit function for a DRAM circuitry is built in the I/O circuit 2a of the logic semiconductor chip 2. Furthermore, a power supply circuit function for the DRAM circuitry is built in the power supply circuit of the logic semiconductor chip 2.

In addition, electrode pads 2b and 3b (shown only in the plane view) pursuing connections between the semiconductor chips 2 and 3, and other electrode pads 2c and 3c (shown only in the plane view) are provided for each semiconductor chips 2 and 3.

Furthermore, although not illustrated in the figures, an electrode pad of 20 μm×20 μm square and a testing pad of 100 μm×100 μm square connected thereon, are provided for each semiconductor chips 2 and 3, as a portion of an upper layer wiring connected to the I/O circuit 2a and 3a. In addition, circuit testing is done by hitting the inspection pad in a wafer form with a needle and, after grinding the wafer from a bottom side and having the wafer spliced into each chip, only chips that have good quality as determined from such circuit testing are picked up as the semiconductor chips 2 and 3.

In addition, an insulation film 4 is formed on the supporting substrate 1 so as to cover these semiconductor chips 2 and 3. In this insulation film 4, connection holes 5 are provided, each reaching the respective electrode pads 2b and 3b on a surface of each respective semiconductor chips 2 and 3.

In addition, wiring connected to each semiconductor chips 2 and 3 is formed on such insulation film 4 through the connection holes 5.

Moreover, on the insulation film 4, an interlayer dielectric 7 having the wiring incrusted therein, a connection hole 8 formed in the interlayer dielectric 7, and an upper layer wiring 9 connected to the wiring on the insulation film 4 through such connection hole 8 are formed to constitute a multi level interconnection structure. These wiring and upper layer wiring 9 are set so that, among the input-output interface circuit 2a and 3a and the power supply circuit of each semiconductor chips 2 and 3, only the I/O circuit 2a and the power supply circuit provided for the logic circuit semiconductor chips 2 and 3 are shared by two of semiconductor chips 2 and 3.

Still, an upper layer insulation film 10 is formed on the interlayer dielectric 7 so as to cover this upper layer wiring 9 and, on this upper layer insulation film 10, a connection hole 11 reaching the upper layer wiring 9 is provided. Furthermore, a protruding electrode 12 connected to the upper layer wiring 9 on the interlayer dielectric 7 (illustrated only in the cross-sectional view) through the connection hole 11 is provided in the upper layer insulation film 10.

In the semiconductor device of such a construction, each semiconductor chips 2 and 3 are directly interconnected by means of the the wiring 6 and the upper layer wiring 9, formed on the insulation film 4 and the interlayer dielectric 7, without an intermediation of the supporting substrate 1. In addition, connection with an outside device is provided by means of the protruding electrode 12. As a result, it is not necessary to establish space for the electrode pads and the wiring on the supporting substrate 1, so that it is enough to have only space for carrying the semiconductor chips 2 and 3. Therefore, it is possible to pursue downsizing of the semiconductor device and to achieve a high-density assembly.

Furthermore, as interconnection between each of the semiconductor chips 2 and 3 can be done directly by means of the wiring 6 and the upper layer wiring 9 without utilization of wire, enhanced functionality can be achieved as it becomes possible to increase wire connection density, along with the realization of high-speed operation.

Still, in this semiconductor device, as the I/O circuit 2a provided in the logic semiconductor chip 2 and the power supply circuit are shared between two of the semiconductor chips 2 and 3, it is possible to reduce the size of these large circuits of high power consumption, thus enabling the power consumption of the semiconductor device as a whole to be largely reduced. As a result, it is possible to reduce the heating emission of the semiconductor device, thus enabling pursue of improvement of reliability of the semiconductor device.

Next, the process of fabrication of the semiconductor device of the construction above is explained based on cross-sectional views of FIG. 2 and FIG. 3.

Figure 2A:
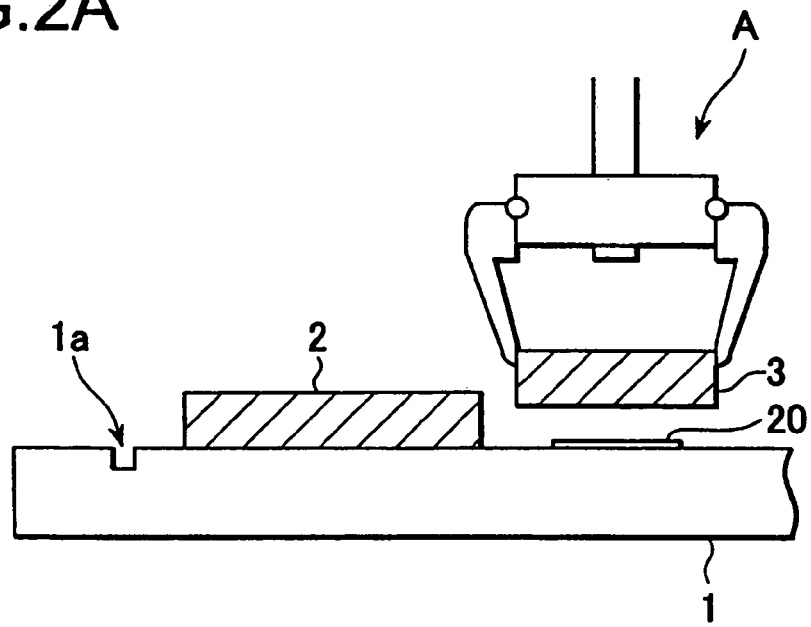
FIG. 2 is a cross-sectional process view (part 1) showing a fabrication process of the semiconductor device according to the first embodiment of the present invention.

At first, as shown in FIG. 2A, on one surface of the supporting substrate 1 made of silicon wafer, a target mark 1a corresponding to a chip arrangement of MCM is formed and, while taking alignment between this target mark 1a and wiring pattern on a surface of each of semiconductor chips table 2 and 3 (not shown in the figure), die bonding of each semiconductor chips 2 and 3 is performed on a determined position of supporting substrate 1, utilizing a die bond device A. At this event, bonding of the supporting substrate 1 with each semiconductor chips 2 and 3 is done by using an electro conductive adhesive 20.

Figure 2B:
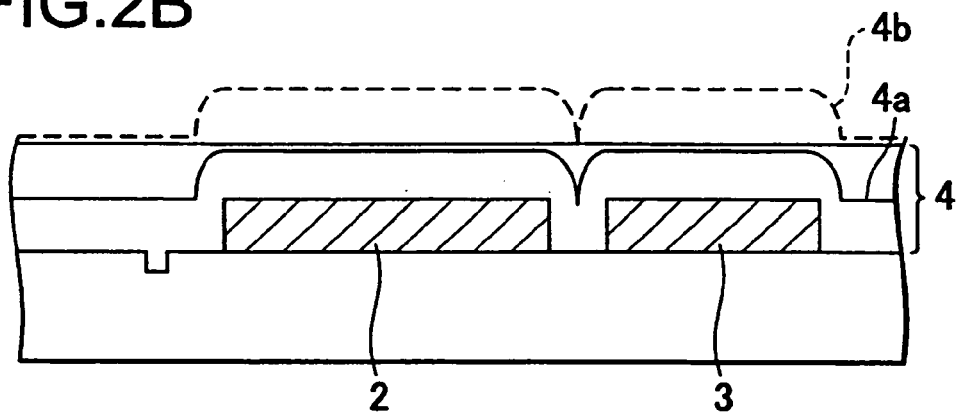

Next, as shown in FIG. 2B, a first insulation film 4a is formed on the supporting substrate 1 so as to have each semiconductor chips 2 and 3 incrusted therein. This first insulation film 4a is formed so as to have a thickness exceeding that of the semiconductor chips 2 and 3. Subsequently, a second insulation film 4b of thickness exceeding a difference in thickness between the semiconductor chips 2 and 3 is formed over the first insulation film 4a. After that, a surface of the second insulation film 4b is ground flat by means of a CMP (Chemical Mechanical Polishing) method and, furthermore, by forming a third insulation film having a thickness of approximately 1 μm (not shown in the figure) over the second insulation film 4b, an insulation film 4 having a flat surface and constituted by laminating each of these insulation films is obtained.

Figure 2C:
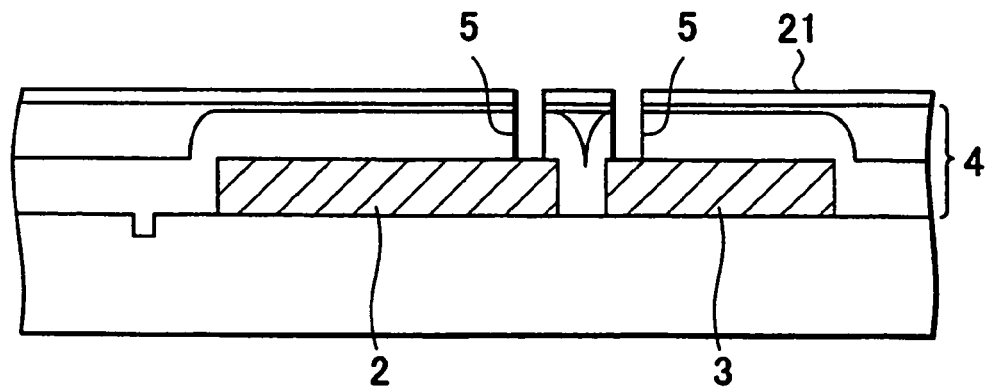

Further, as shown in FIG. 2C, a resist pattern 21 is formed on the insulation film 4 by means of using lithography technology. At this event, while taking alignment with the wiring pattern on the surface of each semiconductor chips 2 and 3, the resist pattern 21 having a hole pattern in a predetermined position is formed upon performing pattern exposure.

Next, the insulation film 4 is etched using such resist pattern 21 as a mask, to then form a connection hole 5 (having, for example, an aperture of 18 μm×18 μm) reaching the electrode pads on the surface of the semiconductor chips 2 and 3.

Figure 3A:
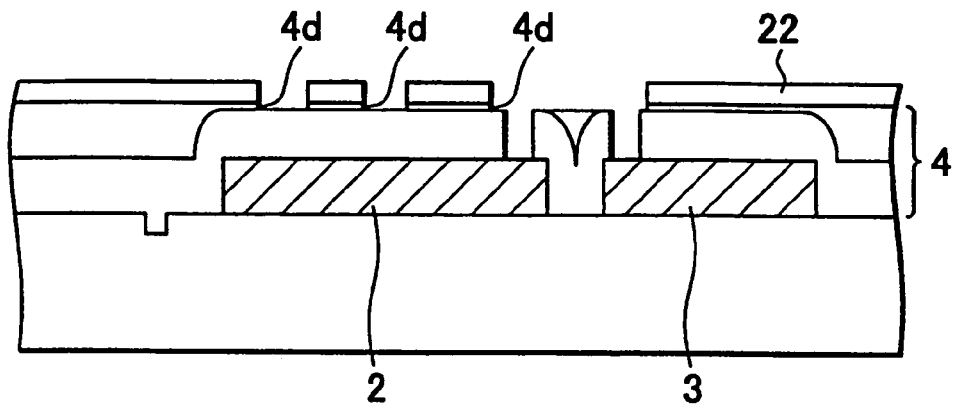
FIG. 3 is a cross-sectional process view (part 2) showing a fabrication process of the semiconductor device according to the first embodiment of the present invention.

Subsequently, after removing the resist pattern 21 from the insulation film 4, a new resist pattern 22 is formed over the insulation film 4 by means of the lithography technology, as shown in FIG. 3A. At this event, while taking alignment with the wiring pattern on the surface of each semiconductor chips 2 and 3, the resist pattern 22 having a hole pattern in a predetermined position is formed upon performing pattern exposure.

Afterwards, the surface layer of the insulation film 4 is etched using such resist pattern 22 as a mask, to then form a wiring trench 4d approximately 2 μm deep on the surface of the insulation film 4.

Then, after removing the resist pattern 22, a copper (Cu) film 50 nm thick is accumulated as a nucleus growth layer by means of a sputter method, on the wiring trench 4d and on the insulation film 4 including an inner wall of the connection hole 5, to then form a Cu film having a thickness of 5 μm by electro less deposition. Then, the Cu on the surface of the insulation film 4 is removed by means of a CMP device for Cu, to then leave Cu only in the wiring trench 4d and the connection holes 5.

Figure 3B:
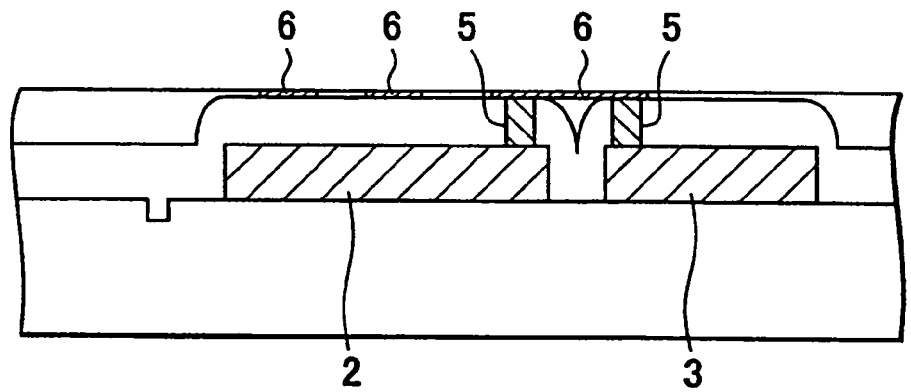

From the above, as shown in FIG. 3B, wiring made of Cu connected to the semiconductor chips 2 and 3 through the connection holes 5 is formed.

In addition, the lithography apparatus used in the formation of the resist pattern 21 and 22 described above and the etching apparatus used in the etching process are processes used in the pre-process of the semiconductor fabrication (in other words, a wafer process). In addition, the alignment for the pattern exposure during lithography can be done for each group of the semiconductor chips 2 and 3 constituting the semiconductor device, as well as for each of the semiconductor chips 2 and 3.

Figure 3C:
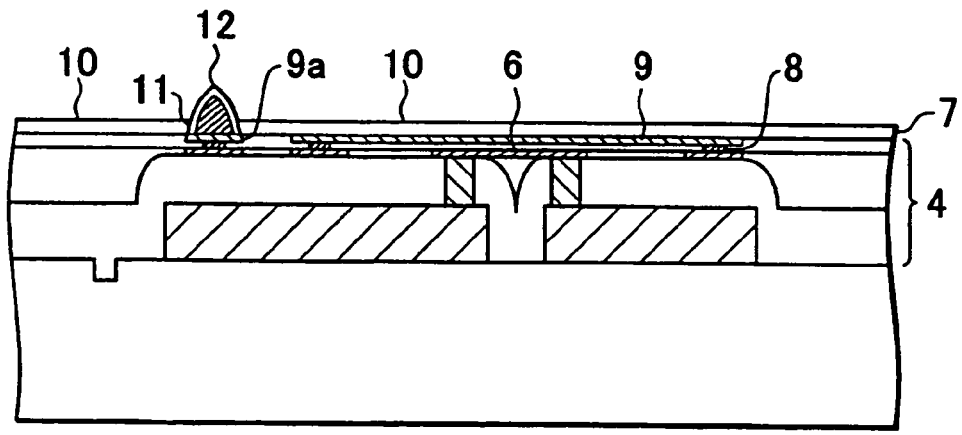

After the above is done, by repeating the process described by means of FIG. 2B to FIG. 3B several times, as shown in FIG. 3C, the interlayer dielectric 7 is formed on the insulation film 4 so as to cover the wiring 6, connection holes 8 are formed in such interlayer dielectric 7 and, furthermore, a top layer wiring 9 connected with the wiring 6 on the interlayer dielectric 7 is formed. By the way, what is illustrated here is a case of having the fabrication process described above repeated once.

Moreover, in the top wiring layer, a pad for formation of a protruding electrode is formed at the same event of the wiring formation. At this event, while forming the top layer wiring 9, a testing pad (not shown in the figure) connected to a protruding electrode formation pad 9a is provided together with such protruding electrode formation pad 9a provided on the interlayer dielectric 7 as part of the top layer wiring 9.

Next, a circuit protection film (not shown in the figure) is formed on the interlayer dielectric 7 so as to cover the top layer wiring 9 and the protruding electrode formation pad 9a, a window is open in this circuit protection film for exposing only the testing pad. Then, after grinding the supporting substrate 1, made of silicon wafer, from another surface so as to reduce its thickness, a MCM performance test and sorting is done by needle-hitting the testing pad with a testing probe.

After the above, after removing the circuit protection film described above, an upper layer insulation film 10 is formed on the interlayer dielectric 7 so as to cover the upper layer wiring 9 and the protruding electrode formation pad 9a, a connection hole 11 is formed on the upper layer insulation film 10 so as to reach the protruding electrode formation pad 9a by means of the lithography method and subsequent etching. Subsequently, a protruding electrode 12 (protruding electrode for MCM assembly), connected with the protruding electrode formation pad 9a through such connection hole 11 is formed on the upper layer insulation film 10.

Next, as indicated in FIG. 1, the supporting substrate 1 made of silicon wafer is divided for each MCM, non-defective units approved by the performance test described above are picked up and resin sealing is done to therefore completing the semiconductor device.

According to such a process of fabrication, the connection holes 5, 8, 11, the wiring 6 and the upper layer wiring 9 are formed by patterning using the lithography technology and the etching technology utilized in the preprocess of the semiconductor fabrication (in other words, the wafer process), then the semiconductor device is obtained by interconnecting each semiconductor chips 2 and 3 directly via such wirings 6 and 9. As a result, compared with the related technology of interconnecting semiconductor chips 2 and 3 through pads and wires formed on the supporting substrate 1, it is possible to increase the wiring density as well as permitting connection from a shorter distance. Therefore, it is possible to pursue increased operation speed and high performance of the semiconductor device.

Furthermore, the utilization of silicon wafer as the supporting substrate 1 permits realization of an easy application for the semiconductor fabrication pre-process.

(second embodiment)

Figure 4A:
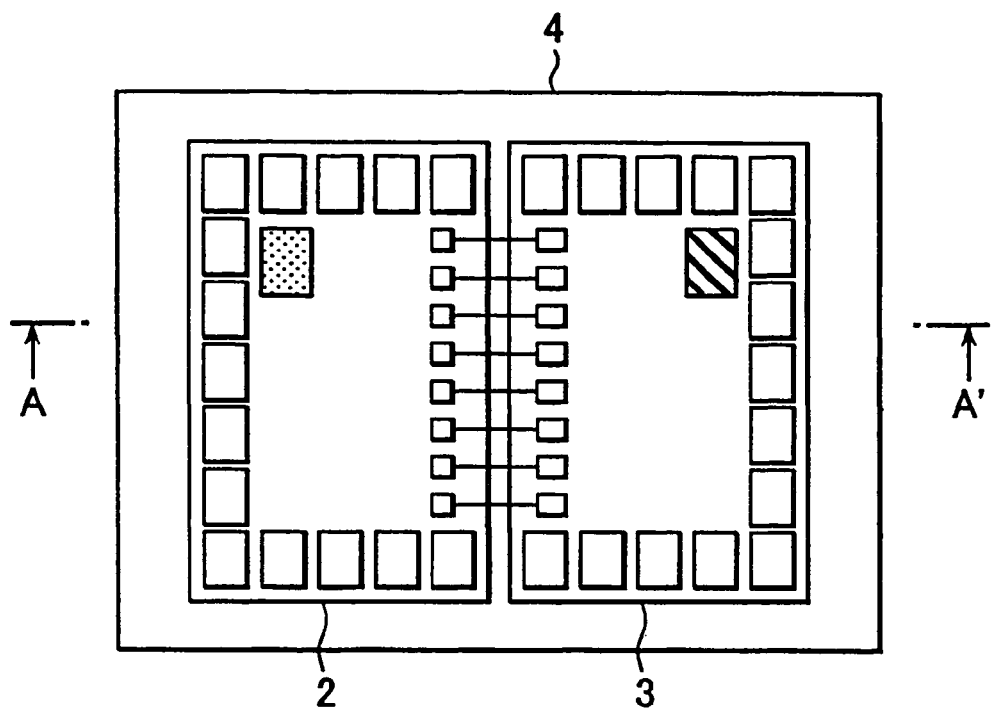
FIG. 4 is a plane view and a cross-sectional view showing a construction of a semiconductor device according to the second embodiment of the present invention.
Figure 4B:
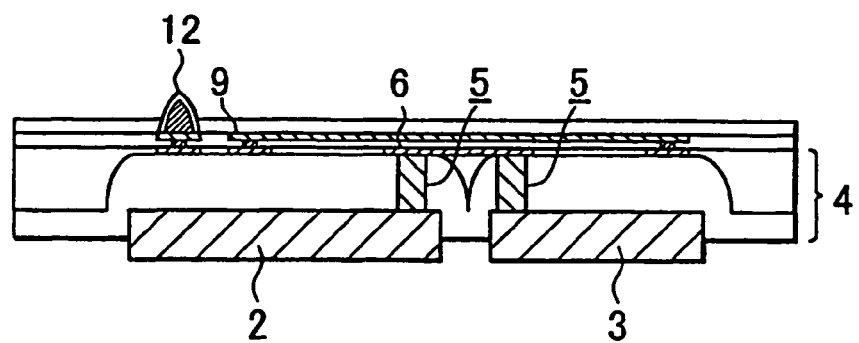

FIG. 4A is a plane view showing a second embodiment of the semiconductor device of the present invention, while FIG. 4B shows an A–A' cross-sectional view of FIG. 4A. What the semiconductor device shown in these figures differs from the semiconductor device of the first embodiment is the way the semiconductor chips 2 and 3 are supported, and other structures are similar.

In other words, such semiconductor device is a MCM with no supporting substrate provided therein, having each semiconductor chips 2 and 3 incrusted in the insulator layer 4 from a surface thereof, so that another surface of the plural semiconductor chips 2 and 3 are exposed. In the present case, the insulator layer 4 is equivalent to the insulation film 4 of the first embodiment.

For this reason, connection holes 5 reaching an electrode pad (not shown in the figures) on the surface of each semiconductor chips 2 and 3 are provided on such insulator layer (insulation film) 4.

In a semiconductor device of such construction, similarly as the semiconductor device of the first embodiment, has each semiconductor chips 2 and 3 directly interconnected by means of wiring 6 and upper layer wiring 9 and, in addition, as connection to an outside device is pursued by means of a protruding electrode 12, a same effect as the semiconductor device of the first embodiment is obtained.

Furthermore, from the fact that the other surface of each semiconductor chips 2 and 3 is exposed, the heat radiation efficiency increases in comparison with the semiconductor device of the first embodiment. As a result, it is possible to improve even more the reliability of the semiconductor. In addition, from the fact that there is no supporting substrate corresponding to the first embodiment, it is possible to make the semiconductor device relatively thinner.

Next, a process of fabrication of the semiconductor device of the construction mentioned above is explained with reference to FIG. 5 and cross-sectional sectional process view of FIG. 6.

Figure 5A:
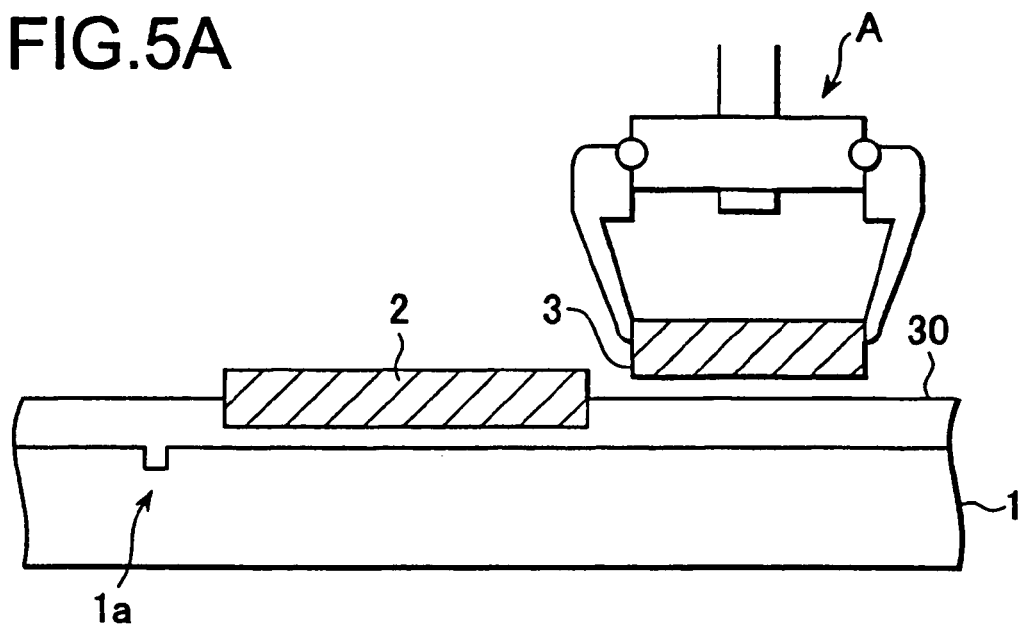
FIG. 5 is a cross-sectional process view (part 1) showing a fabrication process of the semiconductor device according to the second embodiment of the present invention.
Figure 5B:
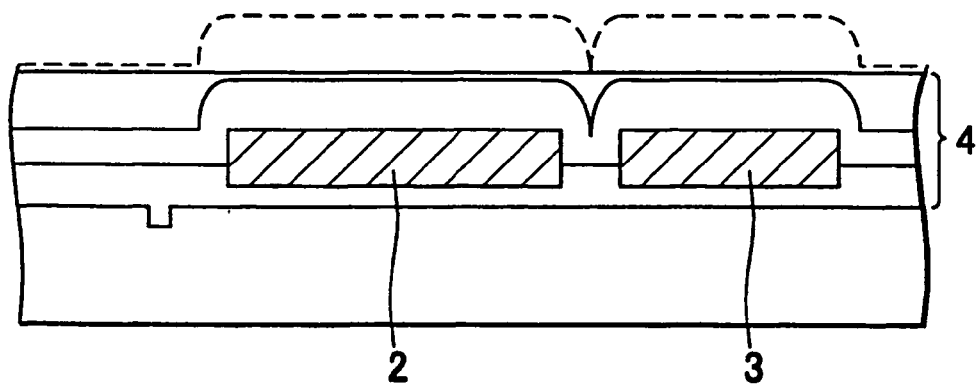
Figure 5C:
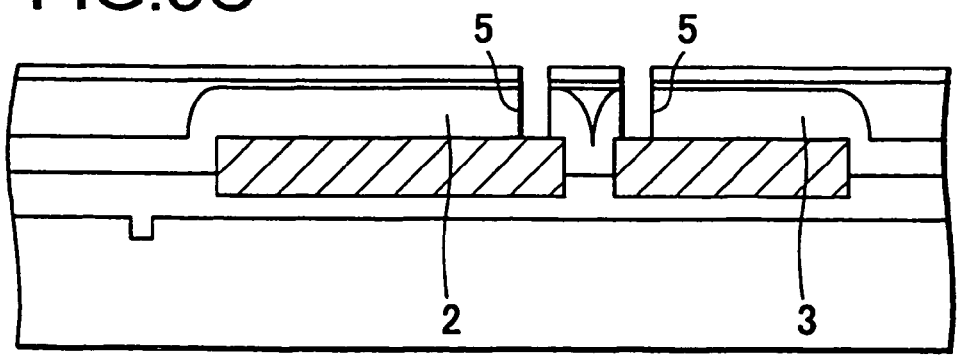
Figure 6A:
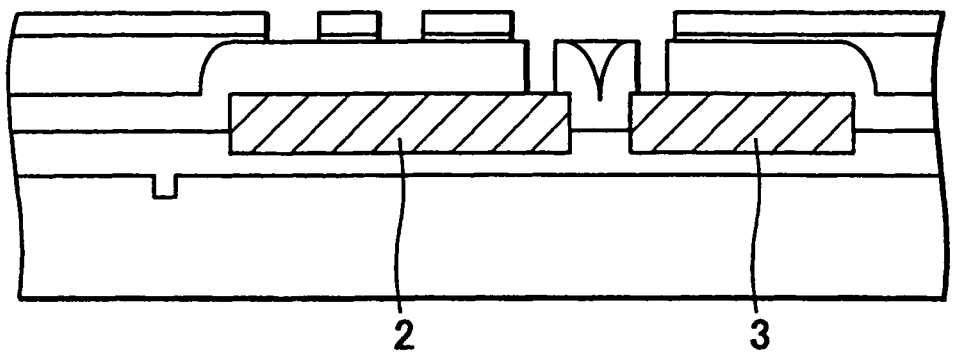
FIG. 6 is a cross-sectional process view (part 2) showing a fabrication process of the semiconductor device according to the second embodiment of the present invention.
Figure 6B:
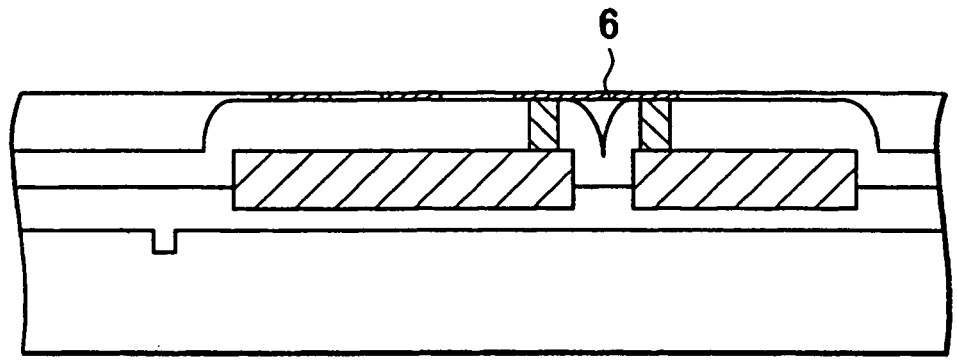

First, as shown in FIG. 5A, a supporting substrate 1 made of silicon wafer is prepared, on which a target mark 1a is formed in a similar way as in the first embodiment, then resin 30 is applied to one surface thereof. Subsequently, while taking alignment between the target mark 1a and wiring patterns (not shown in the figures) on the surface of each semiconductor chips 2 and 3, a die bond device A is used for performing die bonding of each semiconductor chips 2 and 3 to the supporting substrate 1 in a predetermined position, so as to have the semiconductor chips having a surface facing up. At this event, each semiconductor chips 2 and 3 are placed so as to float against resin 30 to then have the surface of each semiconductor chips 2 and 3 adjusted to a same height.

Figure 6C:
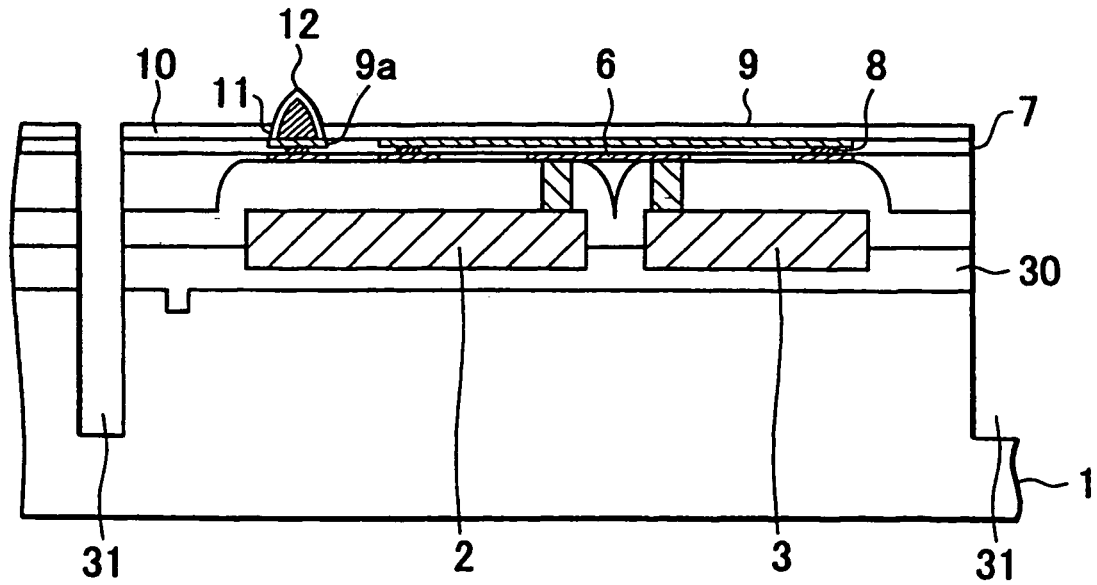
Figure 7A:
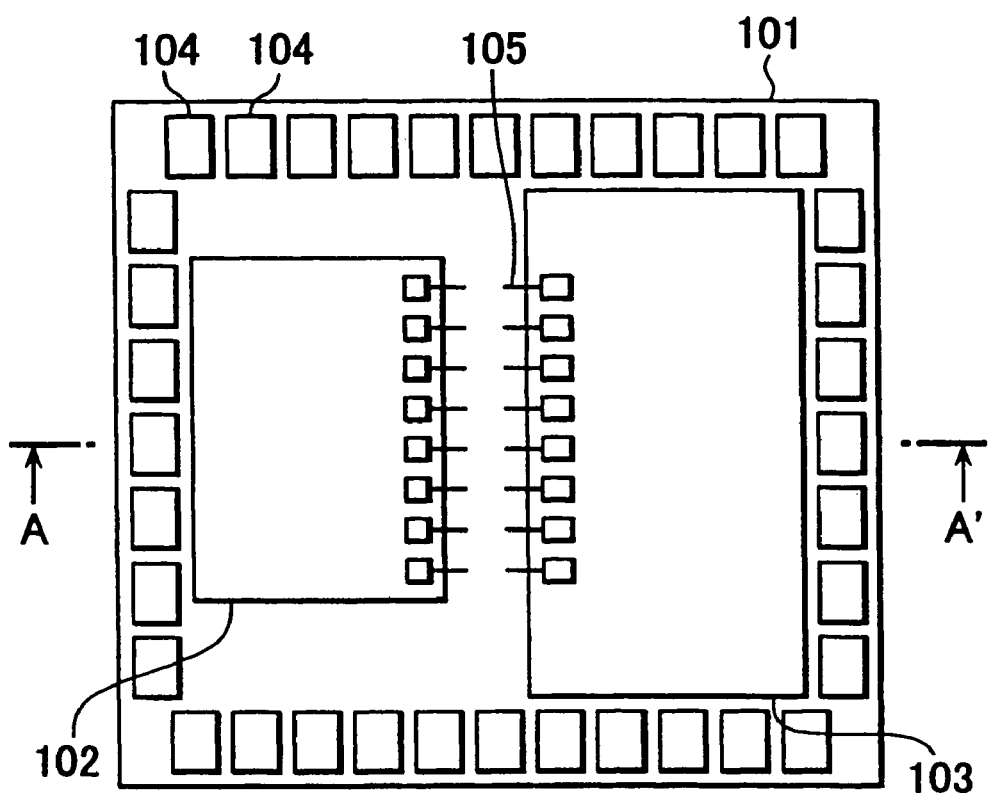
FIG. 7 is a plane view and a cross-sectional view showing a construction of a conventional semiconductor device.
Figure 7B:
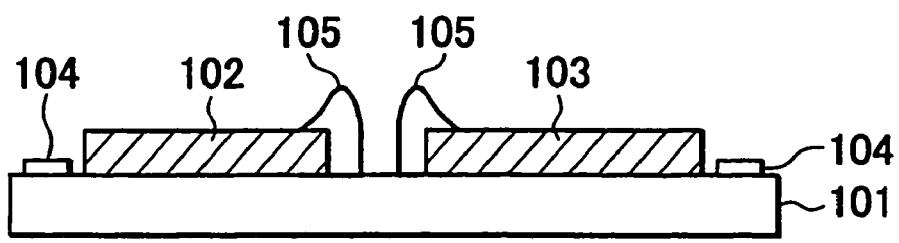

After the above, by proceeding with the process described in FIG. 5B to FIG. 6C in a way similar to the first embodiment explained by means of FIG. 2B to FIG. 3C, as described in FIG. 6C, an insulation film 4 turned to an insulator layer 4, connection holes 5, wiring 6, an interlayer dielectric 7, connection holes 8 and upper layer wirings 9 and 9 a are formed and, after performance test, an upper layer insulation film 10, a connection hole 11 and bump 12 is formed. However, a BGR process for reducing thickness of the supporting substrate 1 done before performance test is omitted so that thickness of supporting substrate 1 is kept as it is.

Next, a dicing process is performed to then form a dicing trench 31 on a border portion of the MCM. However, the dicing trench 31 is provided up to an intermediate depth in the supporting substrate 1.

After the above, the resin 30 between the supporting substrate 1 and each semiconductor chips 2 and 3 and the insulation film 4 is solved by pouring resin solvent solution into the dicing trench 31. From such procedure, as shown in FIG. 4, each MCM is separated from the supporting substrate 1, non-defective units as determined by the performance test are picked up and resin sealing is performed, thus completing the semiconductor device.

According to such process of fabrication, as described through FIG. 5A, it is possible to adjust the surface height of semiconductor chips 2 and 3 to a uniform level by making each semiconductor chips 2 and 3 float on resin 30. As a result, it becomes easy to flatten the insulation film 4 so that it is possible to pursue a thinner semiconductor device.

In addition, it is possible to reduce production cost of the semiconductor device as recycling of the supporting substrate 1 made of silicon wafer is possible.

In each embodiment as explained above, description is made for the case in which the I/O circuit function for the DRAM circuitry is built in the I/O circuit 2a of the logic semiconductor chip 2, the power supply circuit function for the DRAM circuitry is built in the power supply circuit of the semiconductor chip 2, and the wiring 4 and the upper layer wiring 9 are provided so that the I/O circuit 2a and the power circuit of this semiconductor chip 2 are shared between two semiconductor chips 2 and 3. As a result, in the memory semiconductor chip 3, it is not required to establish an I/O circuit 3a and a power supply circuit, so that, by using the memory chip 3 that does not have these circuitry, the size of the memory chip can be reduced, thus further downsizing of the semiconductor device can be realized. Such case can be similarly applied to an electrostatic protection circuit.

In addition, a semiconductor chip having the I/O circuit function, the power supply circuit function, the electrostatic protection circuit function or the like of other semiconductor chips built in, is not limited to the logic semiconductor chip 2, so that it is possible to have the I/O circuit function, the power supply circuit function and further the electrostatic protection circuit function or the like for the logic circuitry included in the memory semiconductor chip 3.

However, when doing circuit test of the semiconductor chip that does not include the I/O circuitry, the I/O circuitry is included in the test probe, so that the circuit test is done via such I/O circuitry upon needle-hitting the test pad of the semiconductor chip.

In addition, in the preferred embodiments mentioned above, description is made for a semiconductor device having a construction in which the I/O circuit function for the DRAM circuitry is built in the I/O circuit 2a of the logic semiconductor chip 2 and the power supply circuit function for the DRAM circuitry is built in the power supply circuit of the semiconductor chip 2, as stated above. However, the semiconductor device of the present invention is also applicable to a semiconductor device having the I/O circuit, the power supply circuit, the electrostatic protection circuit and others provided for each semiconductor chip, in a similar way to a conventional semiconductor device.

In a semiconductor device of such construction, a reduced-scale MCM is constituted as described above by using a multi purpose semiconductor chip for each semiconductor chip. As a result, shipment of each individual semiconductor chip is also possible, thus allowing a choice between shipment of the MCM and the individual semiconductor chip according to a balance between demand and supply. Therefore, it is possible to achieve an expanded production line flexibility and reduction of inventory of semi-finished articles (semiconductor chips, for example), thus allowing reduction of production cost.

Finally, the configurations and structures of respective units and portions described specifically with respect to the preferred embodiments of the present invention are only examples of realization of the present invention, so the embodiments thereof should not be construed as to limiting the technical scope of the present invention.

What is claimed is:

1. A method of fabrication of a semiconductor device, comprising the steps of:
   die bonding of a plurality of semiconductor chips on a substrate;
   forming a target mark in the substrate, the target mark corresponding to the semiconductor chips;
   forming of a first insulation film on said substrate, wherein a top surface and at least a portion of side surfaces of said plurality of semiconductor chips are incrusted in said first insulation film;
   forming a second insulation film directly on and contacting the first insulation film, the minimum height of a top surface of the second insulation film exceeding the maximum height of a top surface of the first insulation film;
   grinding flat the second insulation film;
   forming a third insulation film directly on and contacting the flatly ground second insulation film;
   forming of a connection hole reaching a semiconductor chip of said plurality of semiconductor chips though said first insulation film, said second insulation film, and said third insulation film; and
   forming of wiring on said third insulation film, wherein said wiring is connected to said semiconductor chip through said connection hole.

2. The method of fabrication of a semiconductor device according to claim 1, further comprising the steps of:
   forming of an upper layer insulation film on said third insulation film, wherein said upper layer insulation film covers said wiring;
   forming of a connection hole reaching said wiring, on said upper layer insulation film; and
   forming of an electrode on said upper layer insulation film, wherein said electrode is connected to said wiring through said connection hole.

3. The method of fabrication of a semiconductor device according to claim 1, wherein said substrate is a silicon wafer.

4. The method of fabrication of a semiconductor device according to claim 1, wherein
   said die bonding of said plurality of semiconductor chips on said substrate comprises die bonding of each said semiconductor chips on said substrate, wherein each said semiconductor chip is set so as to float on an adhesive resin applied on said substrate.

5. The method of fabrication of a semiconductor device according to claim 1, wherein
   after said step of forming said wiring, said substrate is removed from said semiconductor chip and said insulation film.

* * * * *